United States Patent [19]
Okishi et al.

[11] 4,168,979
[45] Sep. 25, 1979

[54] LIGHT-SENSITIVE PRINTING PLATE WITH MATT OVERLAYER

[75] Inventors: Yoshio Okishi; Azusa Ohashi; Masaru Watanabe, all of Yoshida, Japan

[73] Assignee: Fuji Photo Film Co., Ltd., Minami-ashigara, Japan

[21] Appl. No.: 758,750

[22] Filed: Jan. 12, 1977

Related U.S. Application Data

[63] Continuation of Ser. No. 560,011, Mar. 19, 1975, abandoned.

[30] Foreign Application Priority Data

Mar. 19, 1974 [JP] Japan .................................. 49-31153

[51] Int. Cl.² .................... G03C 1/76; G03C 1/52; G03C 1/68; G03C 1/70
[52] U.S. Cl. .......................................... 96/75; 96/33; 96/36.3; 96/67; 96/86 P; 96/87 R; 96/115 R
[58] Field of Search ............... 96/33, 86 P, 75, 50 PL, 96/67, 87 R, 115 R, 36.3; 101/457, 459, 465

[56] References Cited

U.S. PATENT DOCUMENTS

| | | | |
|---|---|---|---|
| 2,603,564 | 7/1952 | Maxcy | 96/75 |
| 2,992,101 | 7/1961 | Jelley et al. | 96/50 PL |
| 2,999,016 | 9/1961 | Beeber et al. | 96/75 |
| 3,046,131 | 7/1962 | Schmidt et al. | 96/75 |
| 3,136,637 | 6/1964 | Larson | 96/75 |
| 3,148,064 | 9/1964 | Rauner et al. | 96/115 R |
| 3,201,239 | 8/1965 | Neugebauer et al. | 96/75 |
| 3,211,553 | 10/1965 | Ito | 96/75 |
| 3,507,678 | 4/1970 | Shimizu et al. | 96/67 |
| 3,681,074 | 8/1972 | Poot | 96/83 |
| 3,721,557 | 3/1973 | Inoue | 96/28 |
| 3,778,270 | 12/1973 | Roos | 96/36.3 |
| 3,891,443 | 6/1975 | Halpern et al. | 96/36.3 |

OTHER PUBLICATIONS

Abstracts of Photographic Science and Engineering, #2223/63P, 1963.

Primary Examiner—Charles L. Bowers, Jr.
Attorney, Agent, or Firm—Sughrue, Rothwell, Mion, Zinn and Macpeak

[57] ABSTRACT

A light-sensitive printing plate having a matt layer, which is removable at development, on the surface thereof.

14 Claims, 2 Drawing Figures

LIGHT-SENSITIVE PRINTING PLATE WITH MATT OVERLAYER

This is a Continuation, of application Ser. No. 560,011, filed Mar. 19, 1975.

BACKGROUND OF THE INVENTION

1. Field of the Invention

The present invention relates to a light-sensitive printing plate.

2. Description of the Prior Art

Hitherto, when a light-sensitive printing plate is exposed through an original image, the original image is brought into completely intimate contact with the surface of a light-sensitive layer of the light-sensitive printing plate or, when a resin layer is provided on the light-sensitive layer, the surface of the resin layer (hereinafter referred to merely as the surface of the light-sensitive printing plate), by a method in which the light-sensitive printing plate and the original image superposed thereon have been placed between a rubber sheet and a press glass, and a vacuum is produced in the clearance between the rubber sheet and the press glass (hereinafter, this method is referred to as vacuum contact method). Since hitherto used light-sensitive printing layers have a smooth surface, when the original image is contacted with the light-sensitive printing layer using the vacuum contact method, the contact begins from the periphery. Thus, contact at the center portion is prevented, and an extremely long period of time is required for completely contacting the original image with the entire surface of the light-sensitive printing plate. When an imagewise exposure is applied while the contact is incomplete, a clear image can not be obtained at the portion where the contact is incomplete, and thus a sharp point can not be obtained. The long period of time required for the contact reduces the efficiency of the print-making operation, and thus a reduction in time has been desired for a long time.

As a result of investigating the reduction in the time required for bringing the original image in contact with the light-sensitive printing plate by the vacuum contact method, it has been surprisingly found that the time is markedly reduced by providing on the surface of the light-sensitive printing plate a matt layer which is removable at development.

SUMMARY OF THE INVENTION

An object of the present invention is to provide a light-sensitive printing plate which can be contacted with an original image in a short period of time.

This and other objects and advantages of the present invention will become apparent from the following detailed description.

The objects of the present invention are attained with a light-sensitive printing plate having a matt layer which is removable at development on the surface of the printing plate.

DETAILED DESCRIPTION OF THE INVENTION

Figure 1:
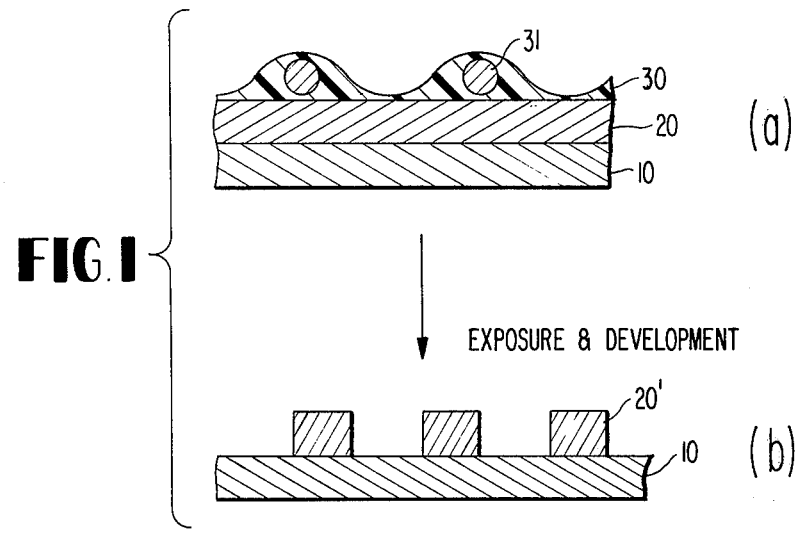
FIGS. 1 and 2 are sectional views of a light-sensitive printing plate according to the present invention and a printing plate produced using the light-sensitive printing plate of this invention.

The present invention provides a light-sensitive printing plate having a matt layer, which is removable at development, on the surface thereof.

As light-sensitive printing plates, on whose surface the matt layer is provided in accordance with the present invention, those light-sensitive printing plates in which a light-sensitive layer is provided on a support can be used. These light-sensitive printing plates include light-sensitive printing plates as used in preparing printing plates such as a planographic printing plate, a letter press printing plate, an intaglio printing plate, and the like.

Suitable supports are those dimensionally stable supports which have been hitherto used as supports for printing plates, and they can be suitably used in the present invention. These supports include paper, synthetic resin (for example, polyethylene, polypropylene, polystyrene, and the like) laminated papers, metal plates such as aluminum (including aluminum alloys), zinc, iron, copper, and the like, synthetic resin films such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, and the like, the above-described metals laminated or vapor-deposited on papers or synthetic resin films, and the like. From these supports, a suitable support can be selected depending upon the type of printing plate. For example, in the case of a light-sensitive planographic printing plate, an aluminum plate, a composite sheet in which an aluminum sheet is bonded to a polyethylene terephthalate film as described in British Pat. No. 1,329,714, and the like are preferred. In the case of a light-sensitive letter press printing plate, a polyethylene terephthalate film, an aluminum plate, an iron plate, and the like are preferred.

The support can be, if desired, subjected to a surface treatment. For example, in the case of a light-sensitive planographic printing place, a treatment to render the surface of the support hydrophilic can be employed. There are various treatments to render the surface hydrophilic. For example, in the case of supports having a synthetic resin surface, a so-called surface treatment, e.g., a chemical treatment, a corona discharge treatment, a flame treatment, an ultraviolet treatment, a high frequency wave treatment, a glow discharge treatment, an active plasma treatment, a laser treatment, and the like, as described in, for example, U.S. Pat. Nos. 2,764,520, 3,497,407, 3,145,242, 3,376,208, 3,072,483, 3,475,193, 3,360,448; British Pat. No. 788,365, etc., or a method of coating a subbing layer after the above-described surface treatment can be used.

Various techniques can be employed as the coating method. For example, suitable coating methods include a multi-layer method in which, as the first layer, a hydrophobic resin layer which adheres well to synthetic resins and has a high solubility is coated, and as the secod layer, a hydrophilic resin layer is coated; and a single layer method in which a resin layer containing a hydrophilic group and a hydrophobic group in the same polymer, is coated.

In the case of a support with a metal surface, particularly an aluminum surface, it is preferred that surface treatments such as a graining treatment, a dip treatment using aqueous solutions of sodium silicate, potassium fluorozirconate, phosphoric acid salts, and the like, or an anodic oxidation treatment are applied. Also, an aluminum plate which is dip-treated in an aqueous solution of sodium silicate after graining as described in U.S. Pat. No. 2,714,066, and an aluminum plate which is dip-treated in an aqueous solution of an alkali metal silicate after an anodic oxidation treatment as described in U.S. Pat. No. 3,181,461 are preferably used. The above-described anodic oxidation is effected by flowing a current through an electrolyte comprising one or more selected from the group of an inorganic acid, e.g., phosphoric acid, chromic acid, sulfuric acid, boric acid, and the like, an organic acid, e.g., oxalic acid, sulfamic acid, and the like, and an aqueous or nonaqueous solution thereof, with the aluminum plate as the anode.

Also, a silicate electro-deposition as described in U.S. Pat. No. 3,658,662 is effective.

These treatments to render the surface hydrophilic are applied to prevent undesired reactions between the support and a light-sensitive composition provided thereon and to improve the adherence of the support to the light-sensitive layer in addition to rendering the surface of the support hydrophilic.

Suitable light-sensitive materials provided on the support are those whose solubility and swelling properties in a developer after and before exposure are changed. Light-sensitive compositions of the negative working type include those light-sensitive compositions which become insoluble due to the action of active rays and which comprise diazo compounds such as a light-sensitive composition comprising a diazo resin and shellac (as described in Japanese Patent Application OPI No. 24,404/1972), poly(hydroxyethyl methacrylate) and a diazo resin, a diazo resin and a soluble polyamide resin (as described in U.S. Pat. No. 3,751,257), an azide light-sensitive material and an epoxy resin (as described in U.S. Pat. No. 2,852,379), an azide light-sensitive material, a diazo resin, and the like; those light-sensitive resins which have an unsaturated double bond in the molecule and which undergo a dimerization reaction upon irradiation with active rays, thereby becoming insoluble, a representative example of which is polyvinyl cinnamate, such as derivatives of polyvinyl cinnamate as described in, for example, British Pat. No. 843,545; U.S. Pat. Nos. 2,725,372 and 3,453,237, light-sensitive polyesters produced by the condensation of bisphenol A and divanillalcyclohexane, and p-phenylenediethoxyacrylate and 1,4-dihydroxyethoxycyclohexane as described in Canadian Pat. No. 696,997, prepolymers of diallyl phthalate as described in U.S. Pat. No. 3,462,267, and the like; ethylene based unsaturated compounds which have at least two unsaturated double bonds and undergo a polymerization reaction upon irradiation of active rays, such as unsaturated esters of a polyol as described in, for example, Japanese Patent Publication No. 8,495/1960, e.g., ethylene di(meth)acrylate, diethylene glycol di(meth)acrylate, glycerol di(meth)acrylate, glycerol tri(meth)acrylate, ethylene di(meth)acrylate, 1,3-propylene di(meth)acrylate, 1,4-cyclohexanediol di(meth)acrylate, 1,4-benzenediol di(meth)acrylate, pentaerythritol tetra(meth)acrylate, 1,3-propyleneglycol di(meth)acrylate, 1,5-pentadiol di(meth)acrylate, pentaerythritol tri(meth)acrylate, bisacrylates and methacrylates of polyethylene glycols having a molecular weight of about 50 to 500, unsaturated amides, particularly amides of α-methylene carboxylic acids and particularly α,ω-diamines, and ω-diamines containing oxygen therebetween, e.g., methylene bis(meth)acrylamide, and diethylenetriamine tris(meth)acrylamide, divinyl phthalate, divinyl terephthalate, divinyl benzene-1,3-disulfonate; and the like, and a suitable binder, for example, polyvinyl alcohol or cellulose derivatives containing a carboxyl group in the side chain, e.g., polyvinyl hydrogenphthalate, carboxymethyl cellulose, or a copolymer of methyl methacrylate and methacrylic acid.

Positive working type light-sensitive materials are those light-sensitive compositions which comprise o-diazooxide based light-sensitive materials as described in U.S. Pat. Nos. 3,635,709, 3,061,430, 3,061,120, a phosphotungstic acid salt of a diazo resin (as described in Japanese Patent Publication No. 7,663/1964), a hexacyanoferrate salt of a diazo resin (as described in U.S. Pat. No. 3,113,023), a diazo resin and polyvinyl hydrogenphthalate (as described in Japanese Patent Publication No. 23,684/1968), or the like. Light-sensitive compositions containing linear polyamides and monomers containing an addition polymerizable unsaturated bond as described in U.S. Pat. Nos. 3,081,168, 3,486,903, 3,512,971, 3,615,629, etc., are also useful.

The light-sensitive printing plate, on whose surface the matt layer is provided, as used herein comprises fundamentally a support and a light-sensitive layer of the above-described light-sensitive material provided on the support, and a light-sensitive printing plate wherein a resin layer is further provided on the light-sensitive layer, can be also used. The latter is described in, for example, Japanese Patent Publication No. 11,558/1962. Namely, this printing plate has a light-sensitive layer and an oleophilic, hydrophobic, water-insoluble and solvent-softening resin layer, in this order, on the support. In general, the amount of the light-sensitive material coated on the support ranges from about 0.2 to 7 g/m$^2$, preferably 0.5 to 5 g/m$^2$. When the light-sensitive printing plate is exposed through an original image, the exposed areas of the light-sensitive layer become insoluble in a developer and at the same time, are bound to the resin layer thereon, while the non-exposed areas remain unchanged and are soluble in the developer, and thus when subjected to development processing, the non-exposed areas of the light-sensitive layer are dissolved in the developer permeating the resin layer on the light-sensitive layer and are removed. Thus, when the surface of the light-sensitive printing plate is gently scrubbed, e.g., the cotton impregnated with the developer, the resin layer at the non-exposed areas is also removed, but the exposed areas of the light-sensitive layer and the resin layer on the exposed areas are not influenced by the developer at all and remain on the support. Thus, a printing plate with a solid image can be obtained.

Suitable methods which can be used for providing on the surface of the above-described light-sensitive printing plate a matt layer which is removable at development include, for example, (1) a method for providing a layer containing a resin which is removable at the development and a matt agent as the most upper layer, and (2) a method comprising providing on the surface of the light-sensitive printing plate a resin layer which is removable at development, and matting mechanically the thus provided layer.

According to method (1) above, a resin layer with the matt agent dispersed therein is provided. As the above-described resin layer, those resin layers are used which are dissolved in the developer and are removed, or are peeled from the light-sensitive layer in the developer.

These resin layers containing the matt agent are removed by development and thus the provision of the resin layer does not influence the printing. FIG. 1 (a) is a sectional view of an embodiment of a light-sensitive printing plate according to the present invention, wherein a light-sensitive layer 20 and a resin layer containing a matt agent 31 are provided, in this order, on a support 10. FIG. 1 (b) is a sectional view of the light-sensitive printing plate of FIG. 1 (a) after exposure and development, in which an image 20' is formed on the support and the resin layer containing the matt agent is removed by the developer.

Figure 2:
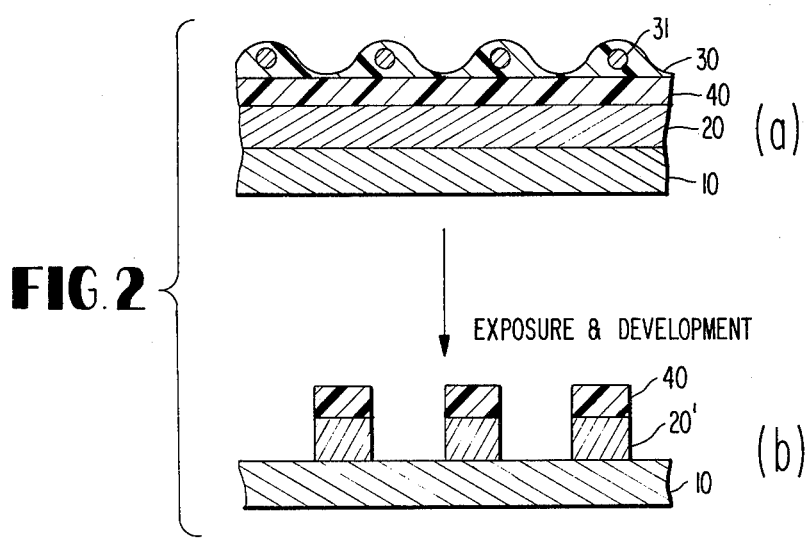

FIG. 2 (a) is a sectional view of another embodiment of the light-sensitive printing plate according to the present invention, in which the light-sensitive layer 20, a resin layer 40 through which the developer permeates, but which is not dissolved in the developer, and a resin layer 30 containing the matt agent 31 are provided on the support 10 in this order. FIG. 2 (b) is a sectional view of the light-sensitive printing plate of FIG. 2 (a) after exposure and development, in which the exposed areas or the non-exposed areas 20' of the light-sensitive layer and the resin layer 40 on the areas alone remain as an image, and the resin layer containing the matt agent is removed by the developer.

Suitable resins for use in the resin layer containing the matt agent as described above can be appropriately selected depending upon the developer to be used. Representative examples include gum arabic, glue, gelatin, casein, celluloses, e.g., sodium cellulose xanthate, methyl cellulose, ethyl cellulose, hydroxyethyl cellulose, hydroxypropylmethyl cellulose, carboxymethyl cellulose, etc., starches, e.g., soluble starches, modified starches, etc., polyvinyl alcohol, polyoxyethylenes, polyacrylic acid, polyacrylamide, polyvinyl methyl ether, sodium polyvinylbenzenesulfonate, polyvinyl pyrrolidone, an epoxy resin, a phenol resin (particularly, a novolak type phenol resin is preferred), a polyamide (including those polyamides which are soluble in alcohols containing 1 to 6 carbon atoms, such as methanol, ethanol, isopropanol, butanol, t-butanol, amyl alcohol, hexanol, etc.), polyvinyl butyral, and the like. These resins can be used individually or in combination with each other. Of these resins, the celluloses, polyvinyl alcohol, polyvinyl pyrrolidone and sodium polyvinylbenzenesulfonate are preferred.

The matt agents which can be used in the present invention include silicon dioxide, zinc oxide, titanium oxide, zirconium oxide, glass particles, alumina, starch, polymer particles, e.g., particles of polymethyl methacrylate, polystyrene, a phenol resin, etc., and the matt agents described in U.S. Pat. Nos. 2,701,245 and 2,992,101. These matt agents can be used individually or in combination with each other. Silicon dioxide and polymer particles are preferred as the matt agent.

The diameter of particles used as the matt agent and the mixing ratio of the matt agent to the resin can be appropriately determined by one skilled in the art depending upon the desired surface coarseness. In the present invention, a suitable surface coarseness ranges from about 0.4 to 4$\mu$ when represented by Ha (Hcla: center line average coarseness) and preferably is in the range of about 0.8 to 1.3$\mu$. Below about 0.4$\mu$, the effect of the present invention in reducing the time required for contacting using the vacuum contacting method is decreased, while above about 4$\mu$, the contact between the light-sensitive printing plate and the original image is incomplete, thereby reducing the sharpness of the image. To achieve a surface coarseness in the above-described range, a suitable diameter of the matt agent particles ranges from about 2 to 40$\mu$, and preferably ranges from about 8 to 15$\mu$. A suitable amount of the matt agent to be added ranges from about 0.05 to 4 parts by weight per part by weight of the binder and preferably ranges from about 0.3 to 2 parts by weight. To provide the resin layer containing the matt agent on the surface of the light-sensitive printing plate, in general, the matt agent is dispersed in a solution of a rein, in which the matt agent is to be dispersed, in a suitable solvent and the resulting solution is coated on the surface of the light-sensitive printing plate. Suitable solvents which can be used are those solvents which are a poor solvent for the matt agent and a good solvent for the resin in which the matt agent is to be dispersed, and furthermore, which do not materially dissolve the surface of the light-sensitive printing plate. These solvents can be easily selected by one skilled in the art when the surface of the light-sensitive printing plate, matt agent, and resin employed are considered. For example, if the matt agent is a water-insoluble inorganic material such as silicon dioxide, titanium oxide, glass particles, etc., and the resin in which it is to be dispersed is water-soluble, water can be used as a solvent and if the matt agent is a material such as a starch and the resin in which the starch is to be dispersed is an epoxy resin or a phenol resin, benzene or xylene can be used as a solvent.

The amount of the matt agent containing resin layer to be coated suitably ranges from about 0.05 to 5 g/m$^2$ on a dry basis and preferably ranges from about 0.2 to 0.4 g/m$^2$.

In accordance with the above-described method (2), the above-described resin layer which is removable with the developer, is provided on the surface of the light-sensitive printing plate, and a flat surface containing sheet, e.g., paper cloth, synthetic resin films, and the like, with fine particles having a higher hardness than the resin layer coated thereon, is pressed against the above resin layer using a press roll to effect matting. Likewise, it is possible to roll the surface of the light-sensitive printing plate by means of a press roll having the desired coarse surface.

Of the above-described matting methods, the method which comprises coating the surface layer containing the matt agent on the surface of the light-sensitive printing plate to be matted is most preferred.

In the case of imagewise exposing the light-sensitive printing plate of the present invention, special techniques due to the matted surface are not required.

The use of the light-sensitive printing plate of the present invention enables the time required for bringing an original image into intimate contact with the surface of the light-sensitive printing plate to be reduced. Thus, the efficiency of plate making processing is advantageously increased and the effect is significant.

The present invention is explained in greater detail by reference to the following example. Unless otherwise indicated, all parts, percents, ratios and the like are by weight.

EXAMPLE 1

A 0.3 mm thick aluminum plate was dipped in a 10% aqueous solution of sodium triphosphate at 80° C. for 3 minutes, washed, and dipped in a 70% nitric acid aqueous solution to effect de-smutting treatment. After washing the plate, the aluminum plate was dipped in a 2% aqueous solution of potassium fluorozirconate at 80°

C. for 3 minutes, and dried after washing. On this aluminum plate was coated a solution having the following composition to provide a light-sensitive layer thereon. The amount of the composition so coated was 500 mg/m² after drying.

| | Quantity (g) |
|---|---|
| 2-Diazo-1-naphthol-5-sulfonic Acid Ester of Polyhydroxyphenyl (described in Example 1 of U.S. Pat. No. 3,635,709) | 5 |
| Cyclohexane | 80 |

On the light-sensitive layer so prepared, a solution of the following composition was coated in a dry weight of 1.0 g/m² and dried.

| | Quantity (g) |
|---|---|
| Water | 100 |
| Hydroxypropylmethyl Cellulose (degree of hydroxypropoxylation: 7 to 12 mol %; degree of methoxylation: 28 to 30 mol %) | 2 |
| Siloid (silica gel produced by Fuji Davison Chemical Ltd.) | 0.2 |

As the Siloid used as the matt agent, those having various average particle sizes (diameter) were used. With the thus obtained light-sensitive printing plates, the time required for contacting an original image using a vacuum contacting method was measured and the results obtained are shown in Table 1.

TABLE 1

| | Average Particle Diameter of Siloid ($\mu$) | Time Required for Contacting (seconds) |
|---|---|---|
| Non-coated | — | More than 60 |
| Siloid-266 | 2 | 50 to 60 |
| Siloid-244 | 3.3 | 40 to 50 |
| Siloid-79 | 4 | 30 to 40 |
| Siloid-161 | 7 | 15 to 20 |
| Siloid-162 | 10 | 10 to 12 |

It can be understood from the results as shown in Table 1 that the use of the light-sensitive printing plate of this invention reduces markedly the time required for contacting the plate with an original image.

Each of the light-sensitive planographic printing plates as prepared above was exposed for 2 minutes to radiation from a 35 ampere carbon arc lamp at a distance of 70 cm and then dipped in a 5% solution of sodium triphosphate for 1 minute. Then, development was effected by gently scrubbing the surface of the printing plate with absorbent cotton. The layer of hydroxypropylmethyl cellulose containing the Siloid was completely removed all over the plate and furthermore, the exposed areas of the light-sensitive layer were removed. Thus, a positive image corresponding to the original image was obtained. Each printing plate exhibited similar printing properties. That is, no influence on printing properties resulted on providing on the surface of the light-sensitive printing plate the resin layer containing the matt agent.

EXAMPLE 2

The procedure of Example 1 was repeated to produce light-sensitive planographic printing plates 1 to 3 wherein the following three coating solutions 1 to 3 were used as the resin layer containing the matt agent. In these coating solutions, the same hydroxypropylmethyl cellulose as used in Example 1 was used.

| Coating Solution | Water (g) | Hydroxymethylpropyl Cellulose (g) | Siloid 162 (g) | Coating Amount (dry weight: g/m²) |
|---|---|---|---|---|
| 1 | 200 | 0.5 | 0.5 | 0.1 |
| 2 | 100 | 1.5 | 0.3 | 0.8 |
| 3 | 100 | 4.0 | 0.2 | 2.5 |

With each of the light-sensitive printing plates, the time required for contacting the plate with the original image was about 10 to 12 seconds. Printing plates were produced in the same manner as in Example 1 using each of the above prepared light-sensitive planographic printing plates and their printing properties were measured. With each of the printing plates, the same results as in Example 1 were obtained.

EXAMPLE 3

The procedure of Example 1 was repeated wherein a solution of the following composition, as the resin layer containing the matt agent, was coated in a dry weight of 1 g/m².

| | Quantity (g) |
|---|---|
| Water | 100 |
| Polyvinyl Alcohol | 2 |
| Phenol Resin Powder (molecular weight: about 3000; average particle diameter: 7 to 8 $\mu$) | 0.2 |

With this light-sensitive planographic printing plate, the time required for contacting the plate with the original image was 15 to 20 seconds. A printing plate was produced in the same manner as in Example 1 using the above prepared light-sensitive planographic printing plate, and its printing properties were measured. The same results as in Example 1 were obtained.

EXAMPLE 4

The procedure of Example 1 was repeated wherein a solution of the following composition as the resin layer containing the matt agent was coated in a dry weight of 1.5 g/m².

| | Quantity (g) |
|---|---|
| Polyvinyl Pyrrolidone | 1 |
| Polyvinyl Butyral | 1 |
| Siloid | 0.2 |
| Chloroform | 100 |

As the Siloid, those having various diameters were used.

With the thus-produced light-sensitive planographic printing plates, the time required for contacting the plate with the original image was measured and the results obtained are shown in Table 2.

TABLE 2

| Siloid | Average Particle Diameter of Siloid ($\mu$) | Ha Value ($\mu$) | Time Required for Contacting (seconds) |
|---|---|---|---|
| 266 | 2 | 0.32 | 60 to 50 |
| 244 | 3.3 | 0.4 | 50 to 40 |

TABLE 2-continued

| Siloid | Average Particle Diameter of Siloid (μ) | Ha Value (μ) | Time Required for Contacting (seconds) |
|---|---|---|---|
| 79 | 4 | 0.5 | 40 to 30 |
| 161 | 7 | 0.8 | 20 to 15 |
| 162 | 10 | 1.08 | 12 to 10 |

It can be understood from the results shown in Table 2 that the use of the light-sensitive planographic printing plate of the present invention markedly reduces the time required for contacting the original image with the printing plate.

Each light-sensitive planographic printing plate was exposed and developed in the same manner as in Example 1. The resin layer containing the Siloid was completely removed all over the plate and furthermore the exposed areas of the light-sensitive layer were removed. Thus a positive image corresponding to the original image was obtained. Each printing plate exhibited the same printing properties as in Example 1.

EXAMPLE 5

The procedure of Example 4 was repeated to produce a light-sensitive printing plate wherein the same amount of a phenol resin powder (molecular weight: about 3000; average particle diameter: 7 to 8μ) was used as the matt agent in place of the Siloid. The time required for contacting the original image with the plate was 15 to 20 seconds.

EXAMPLE 6

A 0.3 mm thick aluminum plate was dipped in a 10% aqueous solution of sodium triphosphate maintained at 80° C. for 1 minute to effect dewaxing. After washing, the aluminum plate was grained by scrubbing with a nylon brush while flowing a solution of pumice dispersed in water over the plate. After the aluminum plate was sufficiently washed, the plate was dipped in a 5% aqueous solution of JIS No. 3 sodium silicate ($SiO_2$/$Na_2O$ (molar ratio)=3.1 to 3.3) maintained at 75° C. for 3 minutes. After washing and drying the plate sufficiently, a solution of the following composition was coated in a dry weight of 1 g/m² and dried to provide a light-sensitive layer.

| | Quantity (g) |
|---|---|
| Shellac | 10 |
| Polyvinyl Acetate | 1 |
| Condensate of Hexafluorophosphoric Acid Salt of 4-Diazo-4'-methoxyphenylamine and Formaldehyde | 3 |
| Methylene Blue | 0.3 |
| Methanol | 200 |
| Furfuryl Alcohol | 50 |

On the light-sensitive layer so prepared, a solution of the following composition was coated in a dry weight of 0.4 g/m² and dried.

| | Quantity (g) |
|---|---|
| Phenol Resin (average molecular weight: 3000) | 1 |
| Siloid 162 | 0.2 |
| Benzene | 100 |

With the thus-prepared light-sensitive planographic printing plate, the time required for contacting the plate with an original image was 10 to 12 seconds. On the other hand, with one in which the resin layer containing the matt agent was not provided, the time required for contacting the original image was 60 seconds or more.

The light-sensitive planographic printing plate, which was brought in contact with the original image, was exposed for 2 minutes to radiation from a 30 ampere carbon arc lamp at a distance of 70 cm. The printing plate was developed by dipping in a developer of the following composition for 10 seconds and scrubbing with a soft cloth. The light-sensitive layer containing the matt agent was dissolved and removed, and thus a printing plate was obtained. The printing properties of the printing plate as obtained above were similar to those of a plate produced from a light-sensitive printing plate not having a resin layer containing a matt agent.

| | Quantity (g) |
|---|---|
| Methanol | 10 |
| Water | 80 |
| Sodium Hydroxide | 1 |

EXAMPLE 7

On an aluminum plate which was grained and described in Example 1, the light-sensitive composition as described in Example 6 was coated to provide a dry weight of 0.8 g/m². On the thus-produced light-sensitive layer, a solution of the following composition was coated to provide a dry weight of 0.6 g/m².

| | Quantity (g) |
|---|---|
| Polyamide (Elvamide 8061, produced by E.I. du Pont de Nemours & Co., molecular weight: about 200,000) | 2 |
| Urea-Formaldehyde Resin Powder (average particle diameter: 4 to 6 μ) | 0.2 |
| Benzene | 100 |

The thus-obtained light-sensitive planographic printing plate could be contacted with the original image in 25 to 33 seconds. However, with the light-sensitive planographic printing plate in which the resin layer containing the matt agent was not provided, the time required for contacting the original image with the plate was 60 to 70 seconds.

The light-sensitive planographic printing plate which was brought into contact with the original image as described above was exposed and developed in the same manner as in Example 6. The resin layer containing the matt agent was peeled off and removed all over the plate, and furthermore the non-exposed areas of the light-sensitive layer were completely removed. This printing plate was not different in printing capability from a plate produced from a light-sensitive printing plate not having a resin layer containing the matt agent.

EXAMPLE 8

On a grained aluminum plate as described in Example 1, a solution of the following composition was coated in a dry weight of 0.12 g/m² and dried to provide a light-sensitive layer.

| | Quantity (g) |
|---|---|
| p-Toluene Sulfonic Acid Salt of a | 1 |

|                                               | Quantity (g) |
| --------------------------------------------- | ------------ |
| Condensate of p-Diazodiphenylamine and Formaldehyde | 5 |
| Ethylene Dichloride                           | 100          |
| Methanol                                      | 100          |

On the light-sensitive layer so prepared, a solution of the following composition was coated.

|                       | Quantity (g) |
| --------------------- | ------------ |
| Polyvinyl Formal      | 4            |
| Phthalocyanine Blue   | 1            |
| Ethylene Dichloride   | 500          |
| Monochlorobenzene     | 20           |

The weight of the above composition after drying was 0.31 g/m² when added to that of the light-sensitive layer. Furthermore, on the thus-prepared layer, a solution of the following composition was coated in a dry weight of 1.0 g/m² and dried.

|                                                   | Quantity (g) |
| ------------------------------------------------- | ------------ |
| Water                                             | 100          |
| Hydroxypropylmethyl Cellulose (as described in Example 1) | 2   |
| Siloid 162                                        | 0.2          |

The thus-obtained light-sensitive printing plate could be brought into contact with an original image in 10 to 12 seconds. On the other hand, with a light-sensitive printing plate in which the resin layer containing the matt agent was not provided, the time required for contacting was 60 to 70 seconds.

The light-sensitive printing plate which was contacted with the original image, was exposed for 1 minute to radiation from a 35 ampere carbon arc lamp at a distance of 70 cm and was developed by dipping in a developer of isopropyl alcohol/water=2:1 (volume ratio) at 20° C. for 1 minute and gently scrubbing the surface with absorbent cotton. The resin layer containing the matt agent was removed all over the plate and furthermore the non-exposed areas of the light-sensitive layer and the polyvinyl formal layer thereon were completely removed. However, the exposed areas of the light-sensitive layer and the polyvinyl formal layer thereon remained without any damage. This printing plate could provide 5,000,000 or more good prints, and it exhibited the same printing capability as that of a printing plate produced from a light-sensitive printing plate in which the matt agent containing resin layer was not provided.

EXAMPLE 9

To 53 g of diethylene glycol (0.5 mole) was added 197 g (1.05 mole) of xylylene diisocyanate, and the mixture was reacted at 80° C. for 2 hours. Then 390 g (1.0 mole) of hydroxyethyl tetraphthalyl acrylate (OH value: 146; average molecular weight: 390) represented by the formula

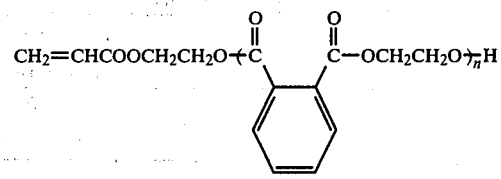

wherein n is the average degree of polymerization and was 1.4 and 0.30 g of 2,6-di-t-butyl cresol as a polymerization inhibitor were added. The resulting mixture was reacted at 80° C. while blowing air through the mixture for 8 hours, and thus a divinyl urethane compound with a remaining isocyanate value of 4.8 was obtained.

To 60 parts of the divinyl urethane compound as produced above were added 40 parts of cellulose acetate hydrogen phthalate: CAP (trade name, produced by Wako Junyaku K. K., phthalic acid content: 32% by weight), 1 part of benzoin ethyl ether as a sensitizer, 0.05 parts of 4,4-thiobis-(3-methyl-6-t-butylphenol) as a thermal polymerization inhibitor, and 0.025 parts of Methylene Blue as an image coloring agent, and the mixture was dissolved in a solvent of 40 parts of acetone and 30 parts of methanol. The resulting solution was allowed to stand at 40° C. for one day and night to effect defoaming. The thus defoamed solution was coated on a 0.3 mm thick, grained aluminum plate in a dry thickness of 0.6 mm and dried to provide a light-sensitive layer. On the light-sensitive layer so prepared, a solution of the following composition was coated in a dry weight of 1.5 g/m² and dried.

|                                               | Quantity (g) |
| --------------------------------------------- | ------------ |
| Water                                         | 100          |
| Polyvinyl Alcohol                             | 2            |
| Phenol Resin Powder (molecular weight: 3000; average particle diameter: 7 to 8 μ) | 0.2 |

This light-sensitive letterpress printing plate could be brought into contact with an original image in 15 to 20 seconds. This plate was exposed using a printer in which 20 watt chemical lamps (fluorescent lamps, rich in UV, produced by Tokyo Shibaura Electric Co., Fl-20 BL) were placed in parallel and at 6 cm intervals, for 10 minutes. The plate was developed by dipping the plate in a developer of the following composition.

|                   | Quantity (g) |
| ----------------- | ------------ |
| Isopropanol       | 0.5          |
| Sodium Hydroxide  | 0.2          |
| Water             | 100          |

The resin layer containing the matt agent was removed all over the plate and furthermore the non-exposed areas were dissolved, and thus a letterpress printing plate of good quality was obtained.

EXAMPLE 10

Carborundum was electrodeposited on a paper impregnated with a urea resin. The surface coarseness was 0.85μ. This paper was superposed on a light-sensitive printing plate on which a resin layer not containing a matt agent was provided, in the same manner as in Example 8 and passed through a pair of rolls. Then the paper was peeled off and thus the surface of the polyvinyl formal layer was matted. The thus-produced light-sensitive printing plate could be brought in contact with an original image in 15 to 20 seconds. This plate was exposed and developed in the same manner as in Example 8 to produce a printing plate. This printing plate could provide 40,000 or more prints of good quality.

While the invention has been described in detail and with reference to specific embodiments thereof, it will be apparent to one skilled in the art that various changes and modifications can be made therein without departing from the spirit and scope thereof.

What is claimed is:

1. A light-sensitive printing plate comprising
   (a) a support,
   (b) a light-sensitive layer on said support, said light-sensitive layer being present in a coating amount of 0.2 to 7 g/m$^2$ and containing a member selected from the group consisting of a diazo resin, an azide compound, and polyvinyl cinnamate as a light-sensitive component of said light-sensitive layer,
   (c) a layer of an oleophilic, hydrophobic, water-insoluble and solvent-softenable resin on the light-sensitive layer (b), and
   (d) a matt layer comprising a resin layer with particles of a matt agent dispersed therein on said resin layer (c), said matt layer having a surface coarseness Ha ranging from about 0.4 to 4 microns and said particles having a particle size of about 2 to 40 microns.

2. The light-sensitive printing plate according to claim 1, wherein the support (a) is selected from the group consisting of paper, a synthetic resin laminated paper, a metal plate, a synthetic resin film, a paper with a metal layer laminated or deposited thereon and a synthetic resin film with a metal layer laminated or deposited thereon.

3. The light-sensitive printing plate according to claim 1, wherein the support (a) is an aluminum plate.

4. The light-sensitive printing plate according to claim 1, wherein the support (a) is a composite sheet comprising an aluminum sheet on a polyethylene terephthalate film.

5. The light-sensitive printing plate according to claim 1, wherein the matt agent in the matt layer (d) is present in an amount of about 0.05 to 4 parts by weight per part by weight of the resin the matter layer (c).

6. The light-sensitive printing plate according to claim 1, wherein
   (i) said resin of the matt layer (d) is a resin soluble in water and said matt agent in the matt layer (c) is selected from the group consisting of particles insoluble in water but soluble in an organic solvent and particles insoluble in both water and an organic solvent, or
   (ii) said resin of said matt layer (d) is a resin soluble in an organic solvent and said matt agent in said matt layer (d) is selected from the group consisting of particles soluble in water and insoluble in an organic solvent and particles insoluble both in water and an organic solvent.

7. The light-sensitive printing plate according to claim 6, wherein
   said resin soluble in water is selected from the group consisting of a cellulose, a starch, polyvinyl alcohol, a polyethylene oxide, polyacrylic acid, polyacrylamide and polyvinyl methyl ether,
   said particles soluble in an organic solvent but insoluble in water are polymer particles,
   said particles insoluble in both water and an organic solvent are selected from the group consisting of SiO$_2$ particles, ZnO particles, titanium oxide particles, zirconium particles, glass particles and alumina particles,
   said resin soluble in an organic solvent is selected from the group consisting of an epoxy resin, a phenol resin, a polyamide resin and polyvinyl butyral, and
   said particles soluble in water but insoluble in an organic solvent are starch particles.

8. The light-sensitive printing plate according to claim 1, wherein the surface coarseness Ha ranges from about 0.8 to 1.3 microns.

9. The light-sensitive printing plate according to claim 1, wherein said particles have a particle size of about 8 to 15 microns.

10. The light-sensitive printing plate according to claim 1, wherein said support (a) is an aluminum plate and said particles have a particle size of about 8 to 15 microns.

11. The light-sensitive printing plate according to claim 1, wherein said light-sensitive component of said light-sensitive layer (b) is said diazo resin.

12. A light-sensitive printing plate comprising
   (a) a support,
   (b) a light-sensitive layer on said support (a), said light-sensitive layer being present in a coating amount of 0.2 to 7 g/m$^2$ and comprising
      (i) a negative-working composition containing a diazo resin, an azide light-sensitive material, a light-sensitive resin having an unsaturated double bond in the molecule which undergoes a dimerization reaction upon irradiation with active rays thereby becoming insoluble, or ethylene-based unsaturated compounds which have at least two unsaturated double bonds and undergo a polymerization reaction upon irradiation with active rays; or
      (ii) a positive-working composition containing an o-diazooxide-based light-sensitive material, a phosphotungstic acid salt of a diazo resin, a hexacyanoferrate salt of a diazo resin, a diazo resin and a polyvinyl hydrogen-phthalate, or a light-sensitive composition containing linear polyamides and monomers containing an addition polymerizable unsaturated bond;
   (c) a layer of an oleophilic, hydrophobic, water-insoluble and solvent-softenable resin on the light-sensitive layer (b), and
   (d) a matt layer comprising a resin layer with particles of a matt agent dispersed therein on said layer (c), said matt layer being removable in both the exposed and unexposed areas upon development, having a surface coarseness Ha ranging from about 0.4 to 4 microns, and containing particles of said matt agent having a particle size of about 2 to 40 microns.

13. The light-sensitive printing plate according to claim 12, wherein the surface coarseness Ha ranges from about 0.8 to 1.3 microns.

14. The light-sensitive printing plate according to claim 12, wherein said particles have a particle size of about 8 to 15 microns.

* * * * *